United States Patent
Bednasz et al.

(10) Patent No.: US 7,477,877 B2
(45) Date of Patent: Jan. 13, 2009

(54) GSM RADIATED SENSITIVITY MEASUREMENT TECHNIQUE

(75) Inventors: Kenneth Bednasz, Raleigh, NC (US); David Story, Fuquay-Varina, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 1019 days.

(21) Appl. No.: 10/776,789

(22) Filed: Feb. 11, 2004

(65) Prior Publication Data
US 2005/0176375 A1   Aug. 11, 2005

(51) Int. Cl.
  *H04B 17/00* (2006.01)
(52) U.S. Cl. ............... 455/67.14; 455/67.11; 343/703; 343/702
(58) Field of Classification Search .............. 455/67.11, 455/67.14; 343/703, 702
  See application file for complete search history.

(56) References Cited

U.S. PATENT DOCUMENTS

| | | | | |
|---|---|---|---|---|
| 5,825,331 | A * | 10/1998 | Lee | 343/703 |
| 6,329,953 | B1 * | 12/2001 | McKivergan | 343/703 |
| 6,760,582 | B2 * | 7/2004 | Gaal | 455/423 |
| 6,795,030 | B2 * | 9/2004 | Klingler et al. | 343/703 |
| 7,035,594 | B2 * | 4/2006 | Wallace et al. | 455/67.12 |
| 7,286,961 | B2 * | 10/2007 | Kildal | 702/182 |
| 2007/0216880 | A1 * | 9/2007 | Qi et al. | 355/53 |

FOREIGN PATENT DOCUMENTS

CA   2 255 810   4/2000

OTHER PUBLICATIONS

"Cellular Telecommunications & Internet Association Method of Measurement for Radiated RF Power and Receiver Performance," *CTIA Certification Program*, Test Plan for Mobile Station Over the Air Performance, Mar. 2003, Revision 2.0, 99 pages.
PCT International Search Report mailed Jan. 31, 2005; PCT Application No. PCT/US2004/027264 filed on Aug. 23, 2004.
Toftgard J et al: "Effects on Portable Antennas of the Presence of a Person" IEEE Transactions on Antennas and Propagation, IEEE Inc. New York, US, Jun. 1, 1993.
Ogawa K et al: "An analysis of the performance of a handset diversity antenna infludenced by head, hand, and shoulder effects at 900 MHz . I. Effective gain characteristics" IEEE Transactions on Vehicular Technology, IEEE Inc. New York, US, May 3, 2001.

* cited by examiner

*Primary Examiner*—Yuwen Pan
(74) *Attorney, Agent, or Firm*—Coats & Bennett, P.L.L.C.

(57) ABSTRACT

A method and apparatus for calculating the radiated sensitivity of a mobile terminal positioned in multiple test orientations for multiple combinations of frequency channel and mobile terminal configuration is described herein. Test equipment measures a reference sensitivity of the mobile terminal when the mobile terminal is positioned in a reference orientation. Further, the test equipment estimates an antenna gain associated with a mobile terminal antenna when the mobile terminal is positioned in a test orientation. The test equipment then adjusts the reference sensitivity, based on the estimated antenna gain, to calculate the sensitivity of the mobile terminal positioned in the test orientation.

41 Claims, 9 Drawing Sheets

GSM RADIATED SENSITIVITY MEASUREMENT TECHNIQUE

BACKGROUND OF THE INVENTION

The present invention relates generally to radiated sensitivity tests and more particularly to radiated sensitivity tests for mobile terminals using Global System for Mobile communication (GSM) technology.

Mobile terminal manufacturers typically test and certify the over-the air performance of a new mobile terminal design before making the mobile terminal available to the consumer market. Such tests are typically performed according to certification standards defined by one or more established review boards, such as the Personal Communication Services (PCS) Type Certification Review Board (PTCRB), the GSM Certification Forum (GSF), and/or the Cellular Telecommunications and Internet Association (CTIA).

An exemplary certification standard is the CTIA Method of Measurement for Radiated RF Power and Receiver Performance, referred to herein as the CTIA receiver standard. The CTIA receiver standard, among other things, defines radiated sensitivity requirements and test procedures for mobile terminals that use Code Division Multiple Access (CDMA), Time Division Multiple Access (TDMA), and/or GSM communication protocols.

According to the current CTIA receiver standard, the test system is required to obtain 144 GSM radiated sensitivity measurements for each of a high, a medium, and a low frequency channel of a frequency band of interest, such as the 1900 MHz or 850 MHz frequency bands, to fully evaluate the GSM radiated sensitivity of the mobile terminal in a specific mobile terminal configuration. These measured sensitivities correspond to 72 different mobile terminal orientations, where each orientation provides a vertical and a horizontal sensitivity measurement. Further, the CTIA receiver standard requires that these tests be repeated for each of a free-space, a left-ear, and a right-ear mobile terminal configuration. Therefore, for a single-band mobile terminal, the CTIA receiver standard requires 144×9=1,296 sensitivity measurements. Assuming that it takes an average of 90 seconds to perform each sensitivity measurement, testing the GSM radiated sensitivity for a single-band mobile terminal takes approximately 32 hours. For dual-band and triple-band mobile terminals, this time increases to approximately 65 hours and 97 hours, respectively. Due to these test times, the radiated sensitivity certification tests may be prohibitively expensive.

Because the final certification tests are time consuming and expensive, manufacturers often perform preliminary tests in-house to identify and correct any potential problems before the final test and certification process begins. While these preliminary tests are often subsets of the final tests, such preliminary tests may still be time consuming and expensive. This is especially true if the mobile terminal design goes through multiple iterations, causing the preliminary tests to be repeated for each iteration. As an example, assume that a manufacturer performs GSM radiated sensitivity tests for three different prototypes of a dual-band mobile terminal before the mobile terminal is ready for final test and certification. In this example, using the time estimates discussed above, the manufacturer has to invest approximately 195 hours of in-house test time just to perform the preliminary radiated sensitivity tests. The manufacturer then has to invest another 65 hours to perform the final GSM radiated sensitivity certification tests. There is a need for a method and apparatus that provides comparable test results in less time, and therefore, at a lower cost.

SUMMARY OF THE INVENTION

The present invention comprises a method and apparatus that calculates the sensitivity of a mobile terminal when the mobile terminal is positioned in a test orientation. Test equipment measures a reference sensitivity of the mobile terminal when the mobile terminal is positioned in a reference orientation. Further, the test equipment estimates an antenna gain of a mobile terminal antenna when the mobile terminal is positioned in the test orientation. The test equipment then adjusts the reference sensitivity based on the estimated antenna gain to calculate the sensitivity of the mobile terminal positioned in a test orientation. This process may be repeated for multiple test orientations and for multiple combinations of frequency channel and mobile terminal configuration.

Exemplary embodiments may also determine a correction factor for each of a plurality of measured power levels reported by the mobile terminal. The test equipment then applies the appropriate correction factor to measured power levels reported by the mobile terminal to correct for measurement errors.

DETAILED DESCRIPTION OF THE INVENTION

Figure 1A:
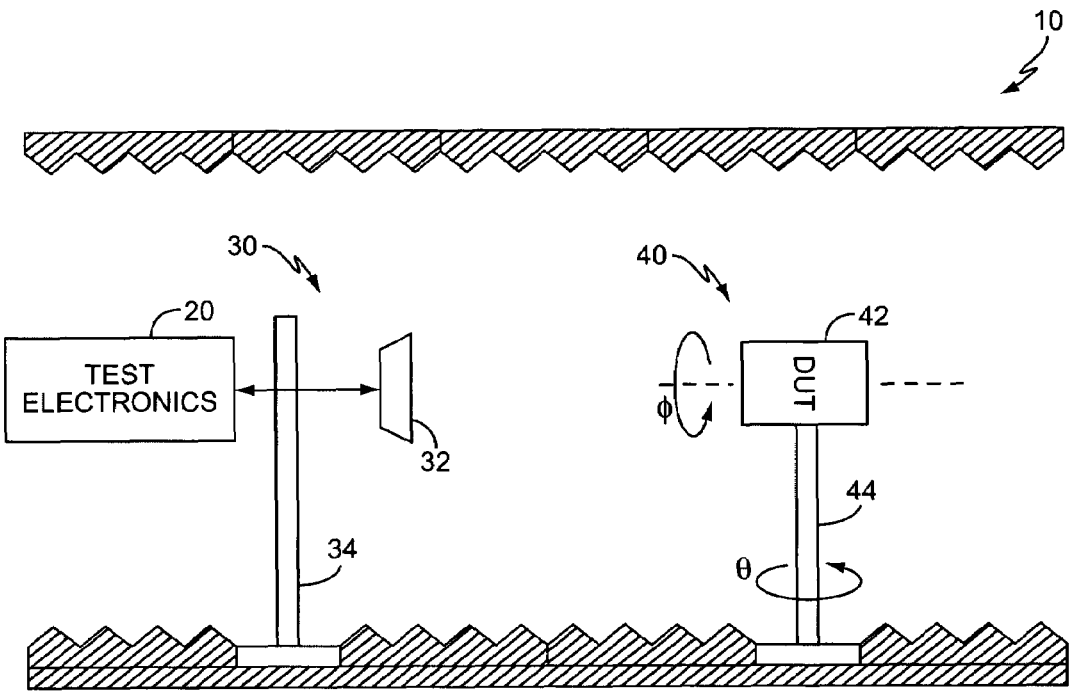
FIG. 1A illustrates a conventional test system using the great circle cut test configuration.
Figure 1B:
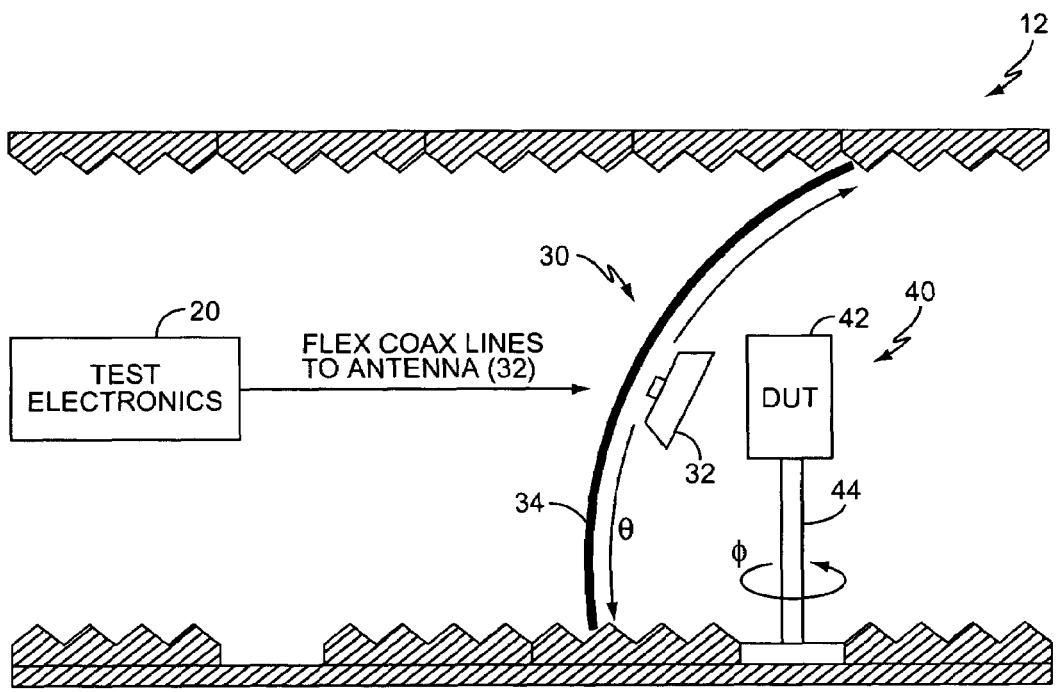
FIG. 1B illustrates a conventional test system using the conic cut test configuration.

The CTIA receiver standard details specific test methods and test set-ups for a multitude of over-the-air receiver tests. FIGS. 1A and 1B illustrate two test setups, the great circle cut setup 10 (FIG. 1A) and the conic cut setup 12 (FIG. 1B), both of which are specified by the CTIA receiver standard. Each test setup 10, 12 includes test electronics 20, an interface system 30, and equipment under test (EUT) 40. Test electronics 20 include all electronics, program instructions, memory, etc., for configuring the test setup, generating test signals, and processing test data received from the EUT 40. Exemplary test electronics 20 may include signal generators for generating the test signals, spectrum analyzers/measurement receivers for receiving and processing the test data, and power splitters for providing signals from the signal generator(s) to both the spectrum analyzers/measurement receivers and the interface system 30.

Interface system 30 interfaces the test electronics 20 with the EUT 40 and comprises a test antenna 32 mounted to an antenna mount 34. Test antenna 32 may comprise any known antenna and typically comprises a horizontal-vertical antenna capable of transmitting and receiving signals in the horizontal and vertical directions. Test antenna 32 provides various test signals to and receives test data from the EUT 40.

Figure 2C:
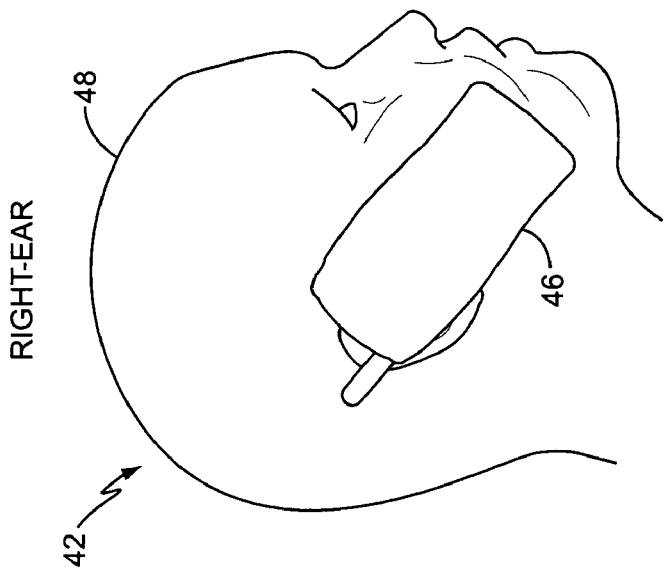
FIGS. 2A-2C illustrate various mobile terminal configurations.
Figure 2B:
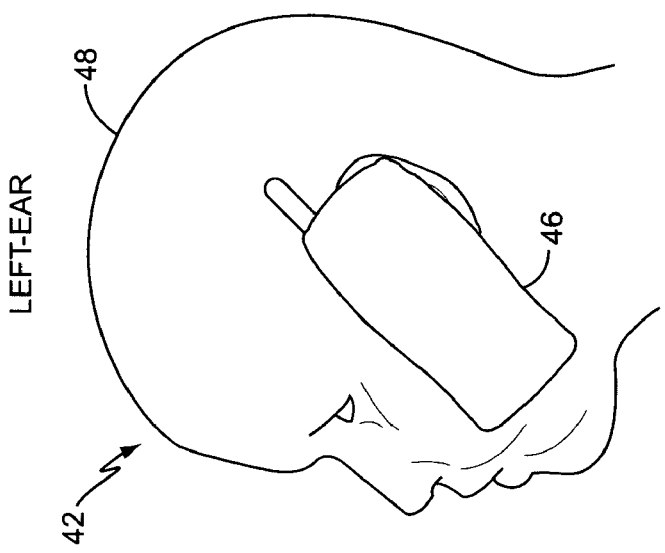
Figure 2A:
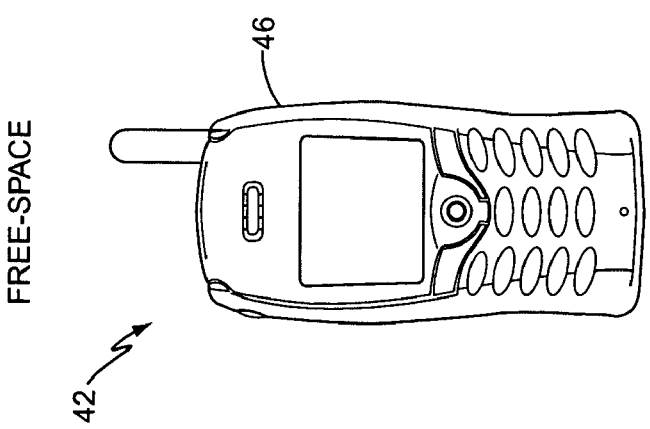

EUT 40 comprises a device under test DUT 42 and a DUT mount 44. Mount 44 positions the DUT 42 in appropriate test orientations throughout the test process, as defined in the CTIA receiver standard. In CTIA test systems, DUT 42 is the mobile terminal 46 being tested. FIG. 2 shows exemplary mobile terminal configurations as defined by the CTIA receiver standard. The free-space mobile terminal configuration, shown in FIG. 2A, is simply the mobile terminal 46 in free-space. The left-ear and right-ear mobile terminal configurations, shown in FIGS. 2B-2C, comprise the mobile terminal 46 positioned at the left ear and right ear, respectively, of a Specific Anthropomorphic Mannequin (SAM) 48. A SAM 48 is a head model for use in simulated head reference testing defined by IEEE Standards Coordinating Committee 34, and is based on the anthropomorphic data of the $90^{th}$ percentile dimensions of the adult male head. Essentially, SAM 48 simulates the impact of the human head on mobile terminal performance.

To acquire the test data for a GSM radiated sensitivity test, the DUT 42 is positioned in multiple orientations relative to the test antenna 32 throughout the test process. Per the CTIA receiver standard, vertical and horizontal test data is gathered from 72 different DUT orientations relative to the test antenna 32, where each orientation differs from the other orientations by 30° in at least one direction. Because each orientation yields a vertical and horizontal sensitivity measurement, 144 sensitivity measurements are obtained for each specific frequency channel and mobile terminal configuration. However, those skilled in the art will appreciate that the test method described herein is not limited to this set number of data points; increasing/decreasing the angular separation between orientations will decrease/increase the number of orientations, and therefore, will decrease/increase the number of test points. As such, it will be appreciated that any number of orientations may be used to acquire any desired number of radiated sensitivity measurements, as required by the applicable test procedure.

As shown in FIGS. 1A and 1B, the great circle cut setup 10 and the conic cut setup 12 use different antenna mounts 34 and DUT mounts 44 to achieve the relative DUT orientations. For example, the great circle cut setup 10 (FIG. 1A) uses a fixed antenna mount 34 and a rotatable DUT mount 44 with two different axes of rotation. In this setup, the different mobile terminal orientations are achieved by the DUT mount 44, which can rotate a horizontally positioned DUT 42 about two perpendicular axes to provide φ rotation (0°-360°) and θ rotation (0°-180°).

The conic cut setup 12 (FIG. 1B) uses an antenna mount with one axis of rotation (θ rotation) and a DUT mount 44 with the other axis of rotation (φ rotation). When the DUT 42 is positioned vertically at the top of the DUT mount 44, the relative movement of the test antenna 32 and the DUT 42 achieves the different mobile terminal orientations. In either system, controlling the θ and φ angles positions the DUT 42 in the desired orientations relative to the test antenna 32.

A conventional GSM radiated sensitivity test may use one of the above described test setups to measure the sensitivity of a mobile terminal 46 at each DUT orientation for each combination of frequency channel and mobile terminal configuration. To determine the sensitivity, the test electronics 20 determine the minimum RF transmit power required to achieve a desired signal quality. This signal quality may be based on bit error rate (BER), frame error rate (FER), or on any other standard measure of signal quality.

The conventional test method sends known bits at a known RF transmit power and evaluates the BER of the bits received by the mobile terminal 46. The RF transmit power is varied and the process is repeated until the desired BER is achieved. The RF power received at the mobile terminal antenna that achieves the desired BER is then recorded as the radiated sensitivity for that orientation, frequency channel, and mobile terminal configuration. Because this method is basically a trial and error approach that must be performed over thousands of test points, the conventional method may be very time consuming, as discussed above.

Figure 3:
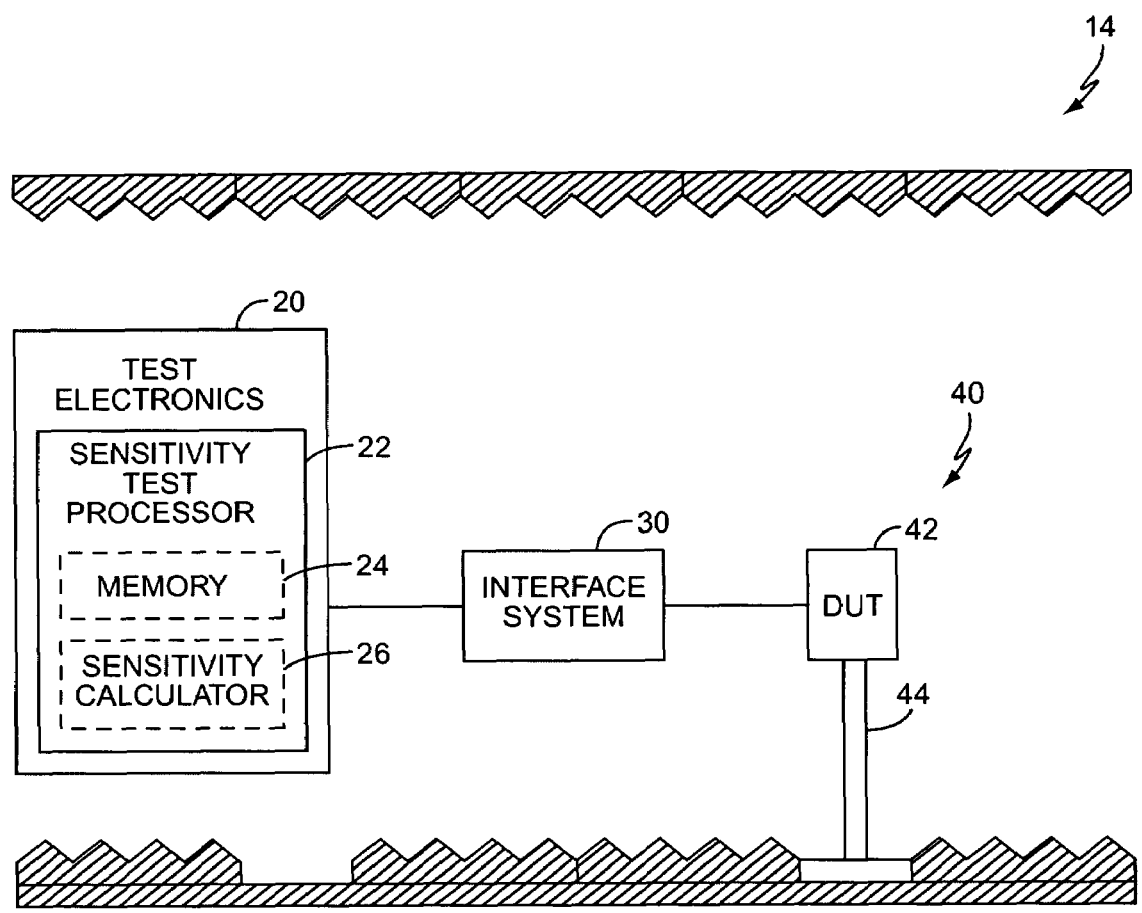
FIG. 3 illustrates an exemplary radiated sensitivity test system according to the present invention.

The new GSM radiated sensitivity test method described herein uses one of the existing test setups 10, 12 of the conventional test system with new software and/or firmware to streamline the measurements and to provide the necessary sensitivity data. FIG. 3 illustrates an exemplary test system 14 that implements the GSM radiated sensitivity test method of the present invention. Test system 14 includes test electronics 20, interface system 30, and EUT 40. The EUT 40 includes the DUT 42 and the DUT mount 44. As described above, DUT 42 comprises a mobile terminal 46 configured in a desired mobile terminal configuration, such as a free-space, a left-ear, or a right-ear configuration.

Test electronics 20 generate test signals and process the test data received from the DUT 42 via the interface system 30. Interface system 30 may comprise an antenna for interfacing the test electronics 20 and the DUT 42 over an air interface or an electrical interface, such as a coaxial cable, for interfacing the test electronics 20 and the DUT 42 with a direct electrical connection. As discussed further below, the appropriate interface system 30 is selected based on the desired test mode.

As shown in FIG. 3, test electronics 20 include a sensitivity test processor 22. Sensitivity test processor 22 is a microprocessor or other programmable circuit, which executes program instructions for implementing the GSM radiated sensitivity test configurations and tests of the present invention. In some embodiments, sensitivity test processor 22 may include memory circuits 24 for storing program instructions associated with the different test configurations and/or for storing test data associated with the GSM radiated sensitivity tests. Memory circuits 24, such as RAM and/or ROM, may be external to sensitivity test processor 22. Sensitivity processor 22 may also include a sensitivity calculator 26 for calculating the radiated sensitivities, as discussed further below. While sensitivity calculator 26 is shown as part of the sensitivity processor 22, those skilled in the art will appreciate that sensitivity calculator 26 may be a separate element within test electronics 20.

Figure 4:
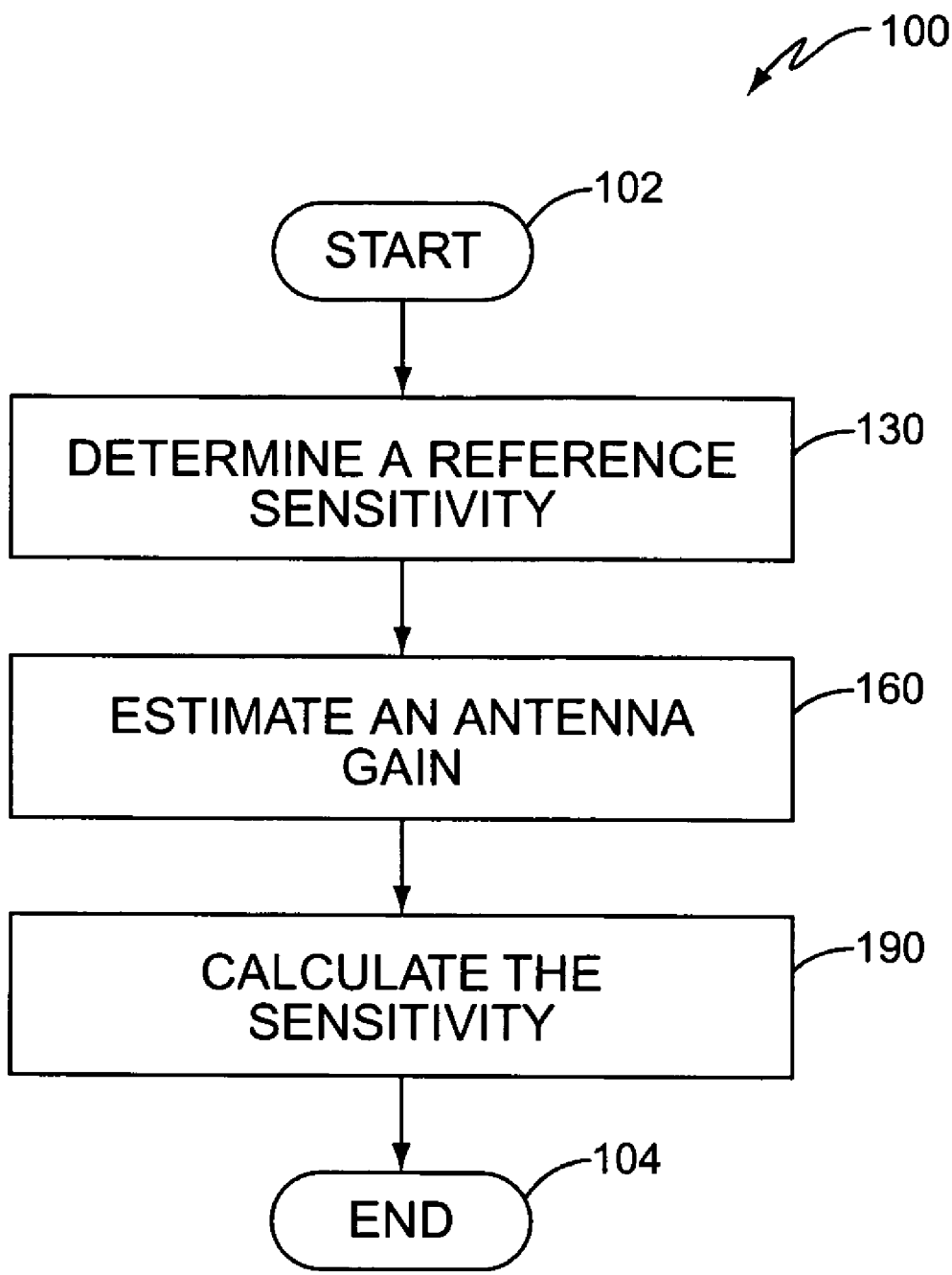
FIG. 4 illustrates an exemplary method for calculating the radiated sensitivity of a mobile terminal according to the present invention.

In combination with the test electronics 20, sensitivity test processor 22 implements a GSM radiated sensitivity method, such as the exemplary method shown in FIG. 4. While the steps in FIG. 4 are shown in a particular order, it will be appreciated by those skilled in the art that these steps may be implemented in any appropriate order.

After the GSM radiated sensitivity test process begins (block 102), the sensitivity test processor 22 configures the test electronics 20 and interface system 30 to identify a reference sensitivity, $S_r$, when the mobile terminal 46 is positioned in a reference orientation (block 130). The reference orientation may comprise any test orientation of the mobile terminal antenna. As discussed further below, $S_r$ is the RF power level measured by a receiver in mobile terminal 46 that corresponds to a desired signal quality, such as a desired BER, FER, etc.

The sensitivity test processor 22 also configures the test electronics 20 and interface system 30 to estimate the antenna gain associated with each mobile terminal test orientation (block 160). In general, the test electronics 20 estimate the antenna gain by comparing a known RF power level applied to the antenna of the mobile terminal 46 and a measured RF power level reported by the mobile terminal 46. Sensitivity calculator 26 calculates the sensitivity, S, associated with each mobile terminal test orientation by adjusting the reference sensitivity, $S_r$, using the estimated antenna gain for each mobile terminal test orientation (block 190). This process is repeated for each mobile terminal test orientation in each combination of frequency channel, such as a high, medium, and low frequency in the frequency band of interest, and mobile terminal configuration, such as free-space, left-ear, and right-ear. Once the radiated sensitivity of each mobile terminal orientation has been calculated for each combination of frequency channel and mobile terminal configuration, the radiated sensitivity test ends (Block 104).

Figure 5:
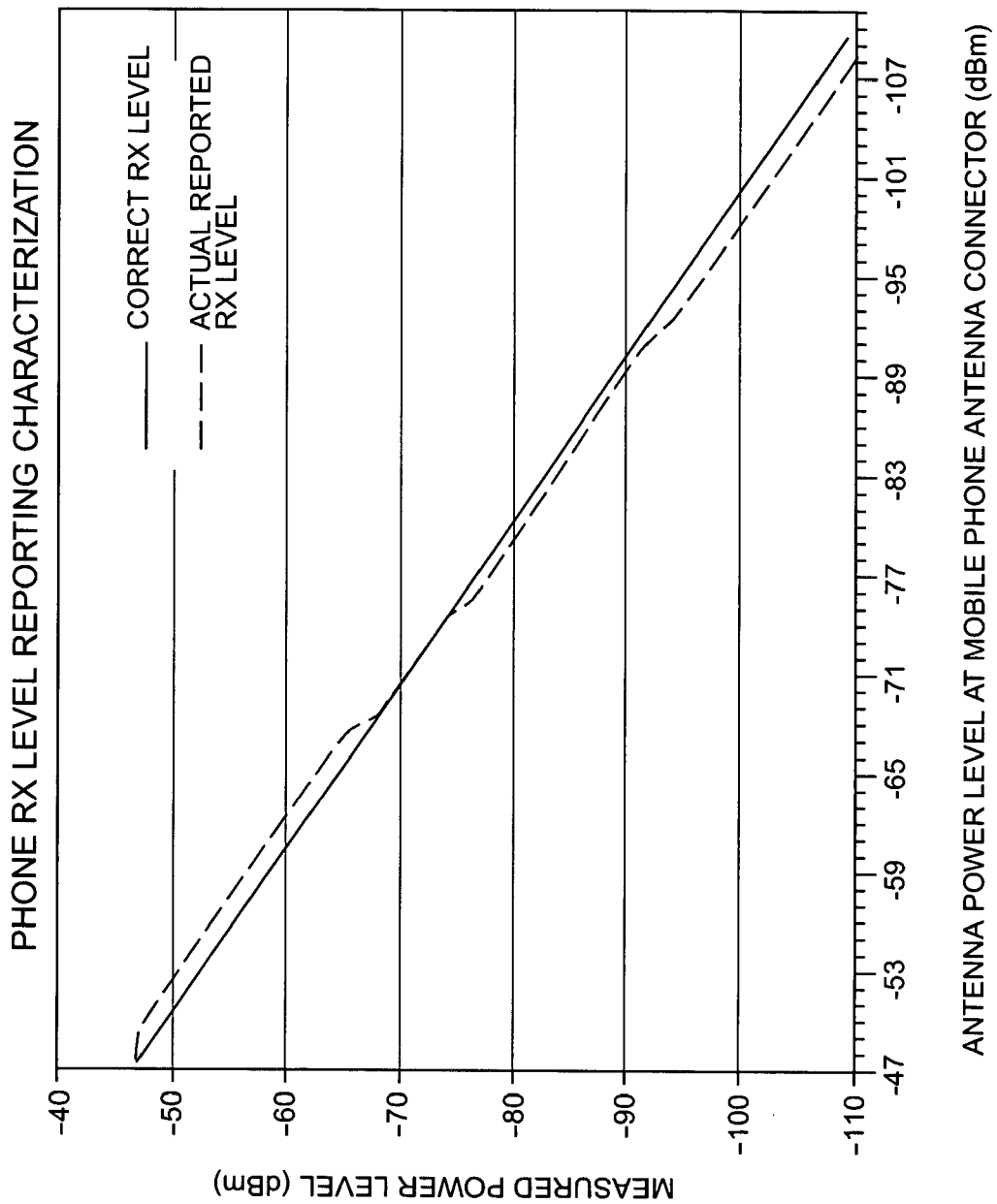
FIG. 5 illustrates an exemplary $P_{meas}$ reporting characterization.

The embodiment of FIG. 4 assumes that the RF power level measured by mobile terminal 46 is equivalent to the power level received at the receiver of mobile terminal 46. However, this assumption is not always valid, as shown in FIG. 5. FIG. 5 illustrates the relationship between a power level provided to the receiver of mobile terminal 46 and a power level measured by mobile terminal 46 and reported to test electronics 20. Ideally, the measured power level is equivalent to the power level provided to the receiver input; the solid line in FIG. 5 represents this scenario. However, in reality, the measured power level is typically not equivalent to the power level provided to the receiver input, as shown by the dashed lines in FIG. 5.

Figure 6:
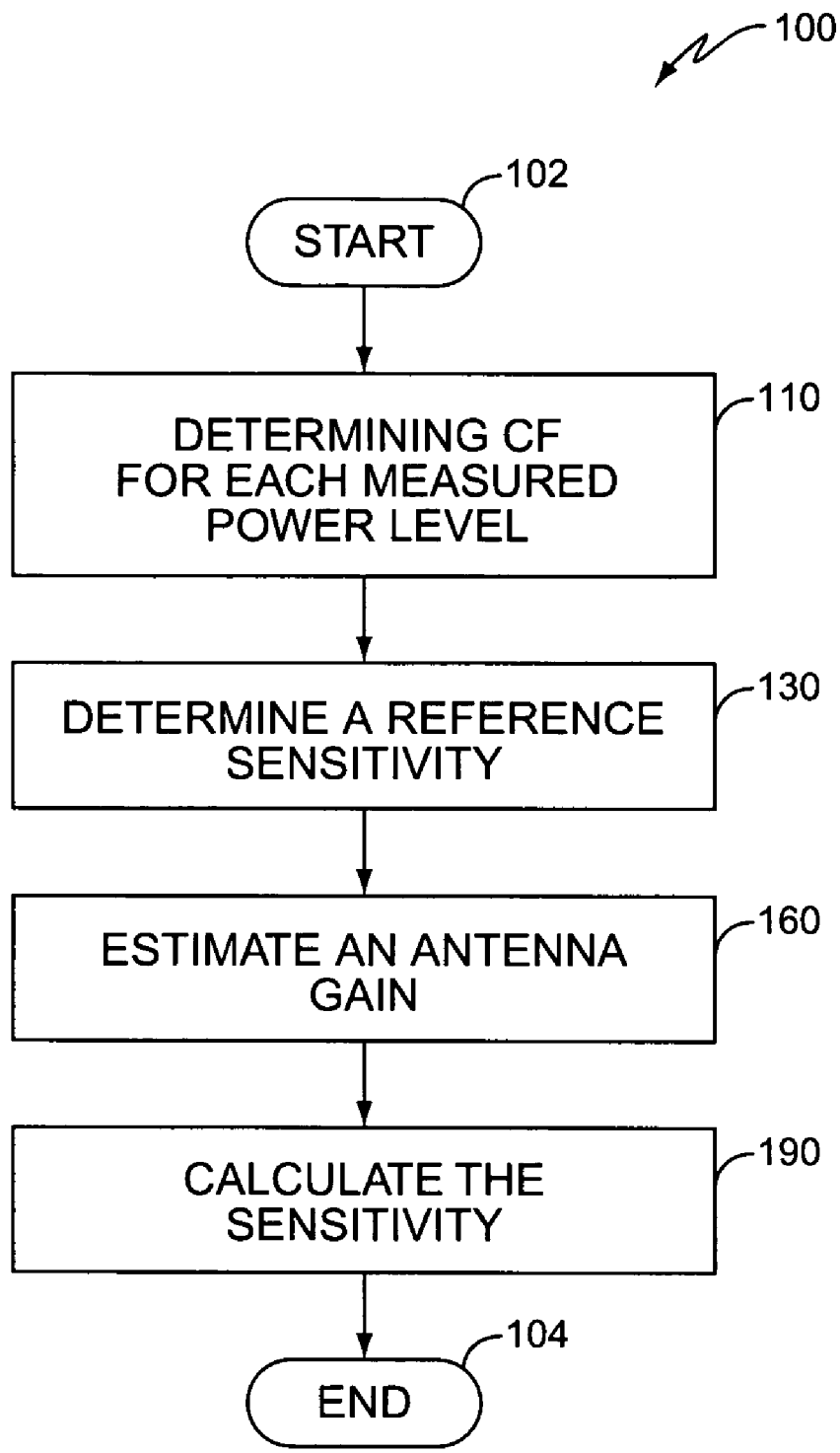
FIG. 6 illustrates another exemplary method for calculating the radiated sensitivity of a mobile terminal according to the present invention.

To correct the discrepancies between the measured power level and the power level received at the receiver of the mobile terminal 46, the method of FIG. 4 may be modified to include the additional step, shown in FIG. 6, of characterizing the accuracy of the power level measured by the mobile terminal 46 by determining a correction factor for multiple measured power levels (block 110) over, for example, the dynamic range of the mobile terminal receiver. In this embodiment, the test electronics 20 use the correction factor corresponding to the measured reference sensitivity to generate a corrected reference sensitivity (block 130). Further, test electronics 20 use the correction factor corresponding to the measured power level reported by the mobile terminal to generate a corrected estimate of the antenna gain (block 160).

Figure 7A:
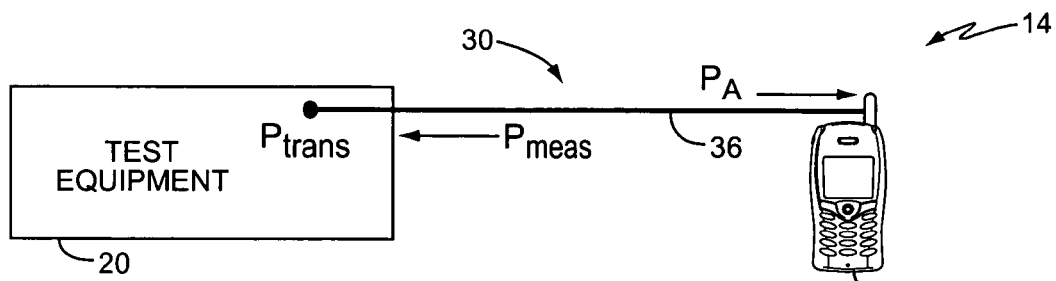
FIGS. 7A and 7B illustrate an exemplary test configuration and method for determining the correction factors according to the present invention.

To characterize the accuracy of the measured power levels reported by mobile terminal 46, interface system 30 is configured to interface the test electronics 20 with the mobile terminal 46 via an electrical interface 36, such as a coaxial cable as shown in FIG. 7A. Specifically, test electronics 20 connect to the receiver input of the mobile terminal 46 via the electrical interface 36. This enables the test electronics 20 to bypass the mobile terminal antenna while evaluating the RF power measurement accuracy of the mobile terminal 46.

Figure 7B:
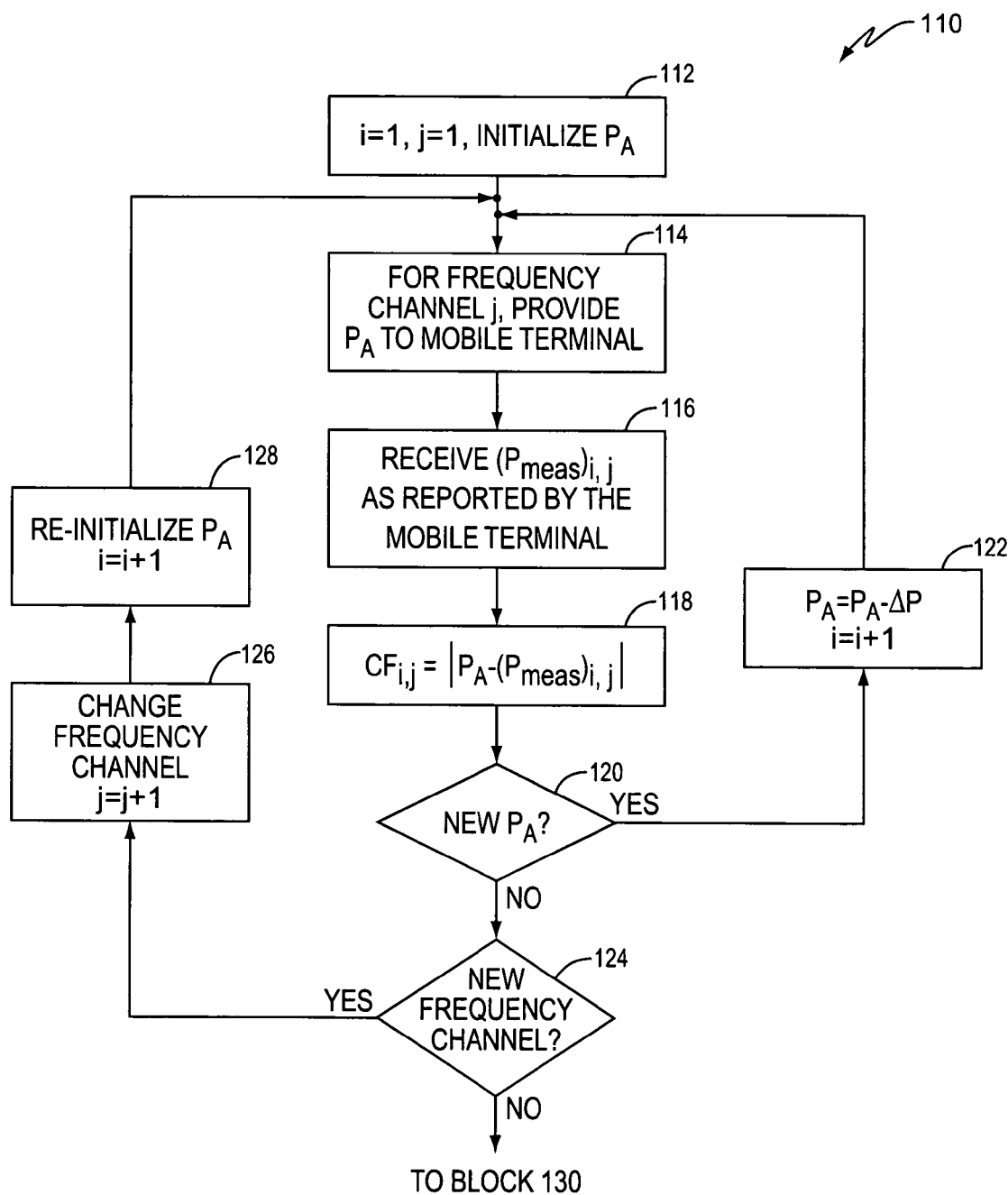

Once the test electronics 20 are directly connected to the receiver input of mobile terminal 46, the accuracy of the measured powers for a particular frequency channel may be characterized according to the exemplary procedure 110 shown in FIG. 7B. After setting an antenna power, $P_A$, to an initial power level (block 112), test electronics 20 apply $P_A$ directly to the mobile terminal receiver input via the electrical interface 36 (block 114). Mobile terminal 46 then measures the received power level and reports the measured power level, $P_{meas}$, to test electronics 20 (block 116) according to any means known in the art. The test electronics 20 compare $P_{meas}$ to the known $P_A$ to determine the correction factor, $CF_{i,j}$, for the measured power level (block 118) at a given frequency channel (j). If additional measured power levels still need to be characterized (block 120), $P_A$ is decremented by a predefined amount $\Delta P$, such as 1 dB (block 122), and the error measurement process (blocks 114 through 118) is repeated for each measured power level generated from a desired range of antenna power levels, such as −48 dBm to −110 dBm at a given frequency channel (j).

If correction factors are required for additional frequency channels (block 124), the frequency channel is changed (block 126), the antenna power is re-initialized (block 128), and the error measurement process (blocks 114 through 122) is repeated for each new frequency channel. As a result, the exemplary method 110 illustrated in FIG. 7B generates a set of correction factors for a range of measured power levels for each desired frequency channel. The correction factor sets may be stored in memory circuit 24.

Figure 8A:
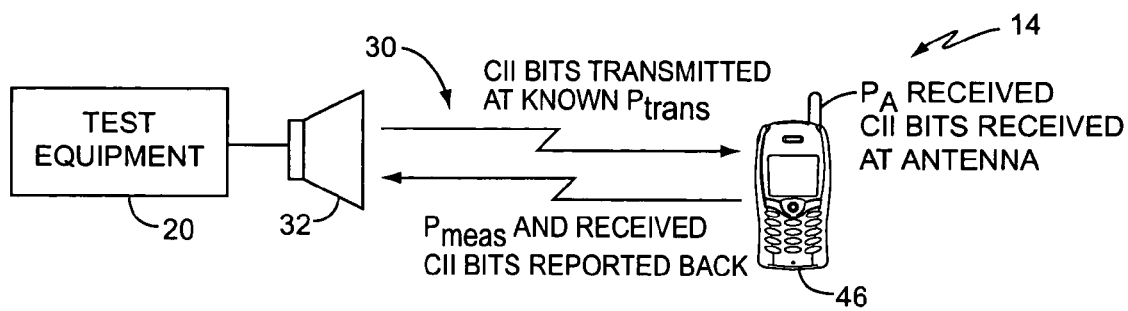
FIGS. 8A and 8B illustrate an exemplary test configuration and method for determining the reference sensitivities according to the present invention.
Figure 8B:
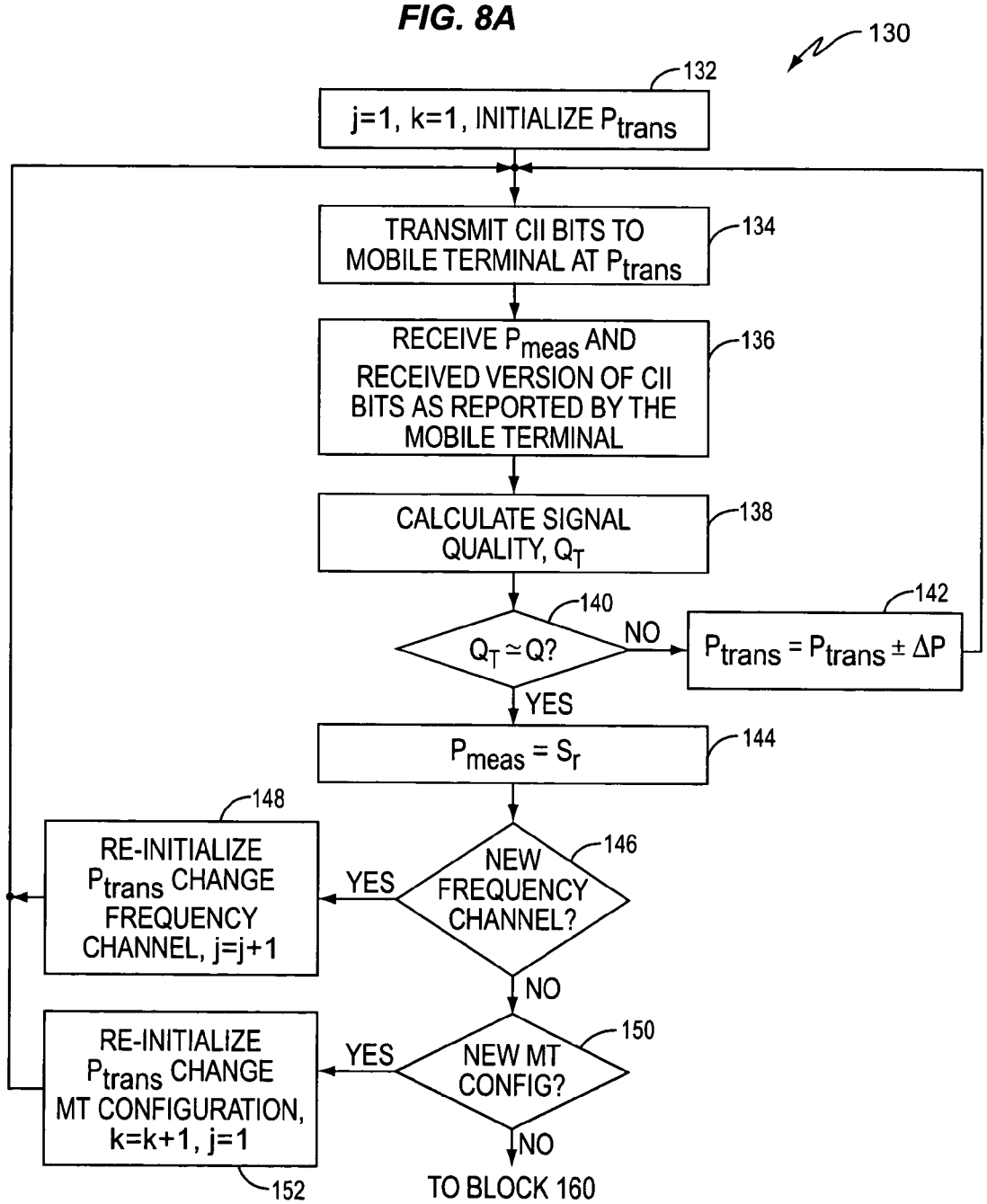

Turning now to FIGS. 8A and 8B, an exemplary test setup and method for determining the reference sensitivity (block 130) will be described. First, to setup the reference sensitivity measurement equipment, the interface system 30 is configured to interface the test equipment 20 with mobile terminal 46 over an air interface using test antenna 32. Further, mobile terminal 46 is positioned in a reference orientation relative to the test antenna 32. In an exemplary embodiment, the reference orientation is any desired test orientation of the mobile terminal 46.

To measure the reference sensitivity, sensitivity test processor 22 may configure the test electronics 20 to implement the exemplary method 130 of FIG. 8B. After a transmit power level, $P_{trans}$, has been initialized (block 132), test electronics 20 transmit a sequence of known bits, such as a sequence of known Class II (CII) bits, to mobile terminal 46 at the defined transmit power level $P_{trans}$ (block 134). Upon receipt of a looped-back version of the transmitted bits and the corresponding measured power level, $P_{meas}$ (block 136), the test electronics 20 calculate a signal quality $Q_T$, such as a BER or FER, associated with the looped-back bits and corresponding to $P_{meas}$ (block 138). If the calculated signal quality generally corresponds to a predefined signal quality (block 140), such as the 2.44% CII BER, the reference sensitivity, $S_r$, is set to the measured power level (block 144). Where appropriate, a correction factor corresponding to $P_{meas}$ is applied to $S_r$ to correct any associated measurement errors.

If the calculated signal quality does not equal the predefined signal quality (block 140), $P_{trans}$ is incremented/decremented by a predefined power level $\Delta P$, such as 0.5 dB (block 142). The reference sensitivity process (blocks 134 through 140) is then repeated until the calculated signal quality generally equals the predefined signal quality (block 140). The reference sensitivity is then set equal to the associated measured power level (block 144). Where appropriate, a correction factor corresponding to $P_{meas}$ is applied to $S_r$ to correct any associated measurement errors.

Once the reference sensitivity has been determined for a first frequency channel and mobile terminal configuration (j=1, k=1), test electronics 20 determine if more frequency channels and/or mobile terminal configurations remain (blocks 146 and 150). For each remaining combination of frequency channel and mobile terminal configuration, test electronics 20 re-initialize $P_{trans}$ (blocks 148 and 150), change the frequency channel (block 148) and/or the mobile terminal configuration (block 152), and repeat the reference sensitivity process (blocks 134 through 144) to determine a reference sensitivity for each combination of frequency channel and mobile terminal configuration.

Figure 9A:
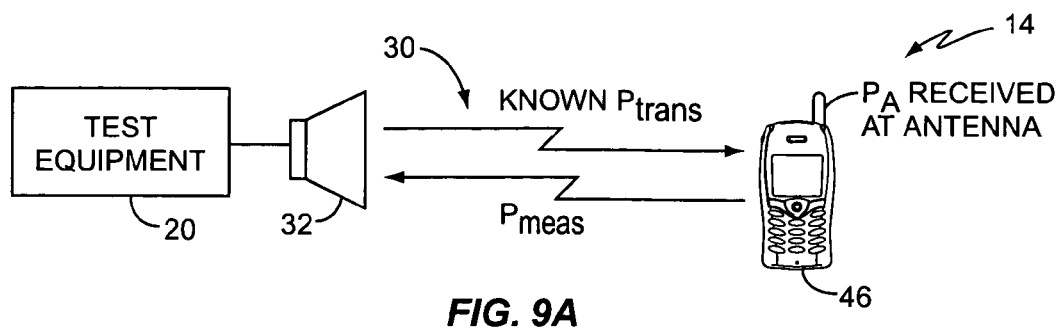
FIGS. 9A and 9B illustrate an exemplary test configuration and method for estimating antenna gain according to the present invention.
Figure 9B:
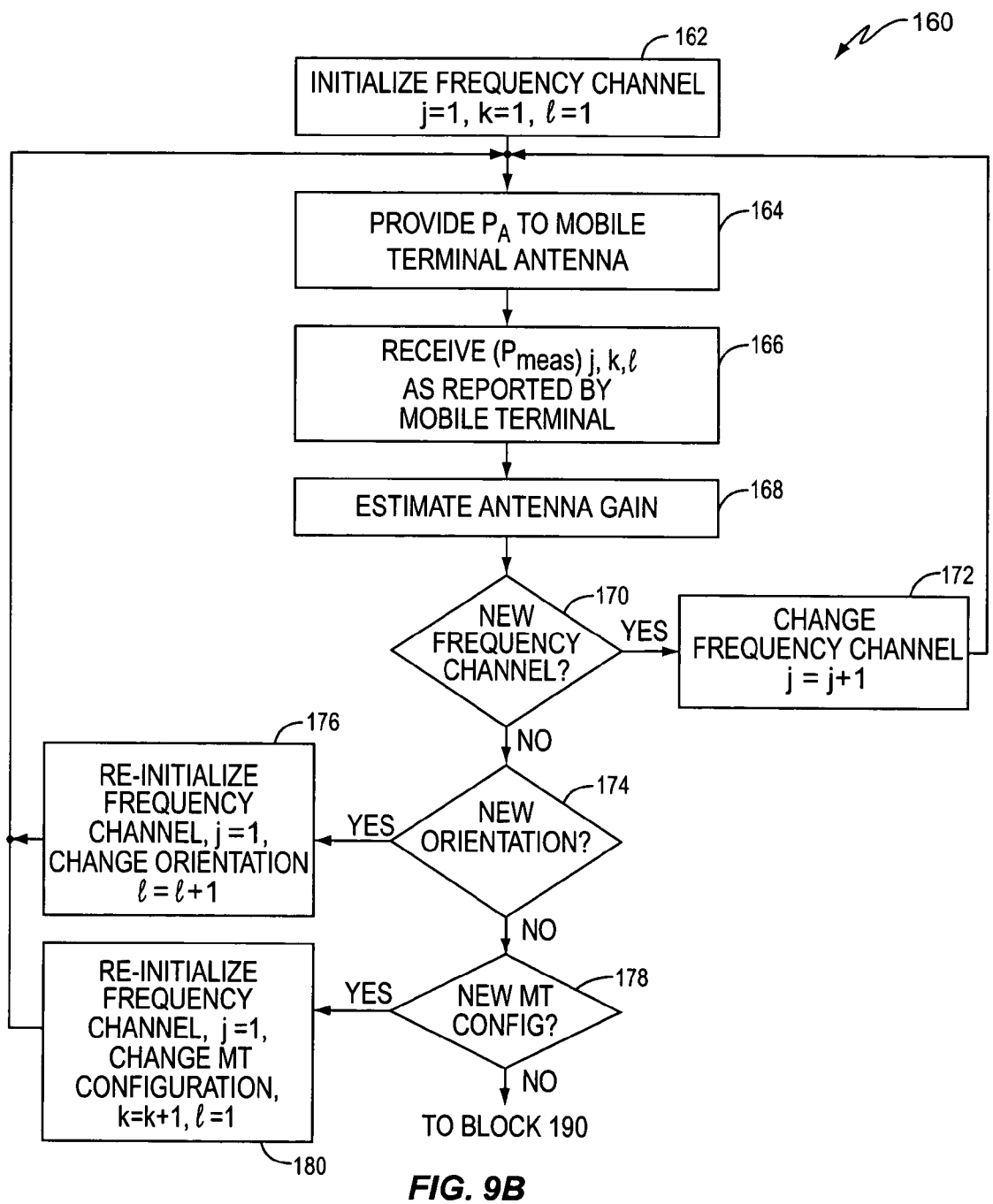

Turning now to FIGS. 9A and 9B an exemplary test setup and method 160 for estimating the antenna gain (block 160) for each of a plurality of mobile terminal orientations will be described. As used herein, "antenna gain" represents the gain or loss of the antenna system of mobile terminal 46. The antenna system includes one or more antennas and any associated electronics that provide the signal received by the antenna system to the mobile terminal receiver. As with the reference sensitivity setup, the interface system 30 is configured to interface the test electronics 20 with the mobile terminal 46 over an air interface using test antenna 32. However, in this test setup, the mobile terminal orientation is varied, as described further below, before each antenna gain is estimated.

To estimate the antenna gain, sensitivity test processor 22 configures the test electronics 20 to implement the exemplary procedure 160 of FIG. 9B. First, the frequency channel of the mobile terminal/DUT is initialized to an initial frequency channel, such as low (block 162). Test electronics 20 then transmit a known $P_{trans}$ to apply a known antenna power level, $P_A$, to the mobile terminal antenna (block 164). In response, mobile terminal 46 reports the corresponding measured power level to the test equipment 20 (block 166).

To estimate the antenna gain, the test electronics 20 compare the known antenna power level, $P_A$, to the measured power level, $P_{meas}$ (block 168). In some embodiments, the correction factor determined in block 110 may be used to improve the accuracy of the antenna gain estimate. In these embodiments, the correction factor that corresponds to $P_{meas}$ is first applied to $P_{meas}$ to generate a corrected power level, $P_{corr}$. The test equipment then compares $P_A$ to $P_{corr}$ to generate a corrected estimate of the antenna gain (block 168).

After an antenna gain estimate has been determined for the current frequency channel, test electronics 20 determine if additional frequency channels remain (block 170). If there are additional frequency channels, the frequency channel is changed (block 172) and the process of blocks 164 through 168 is repeated for each frequency channel of the current mobile terminal orientation and mobile terminal configuration. Once an antenna gain estimate has been determined for each frequency channel of the current mobile terminal orientation and mobile terminal configuration, the test electronics 20 determine if additional mobile terminal orientations and/or mobile terminals configurations remain (blocks 174 and 178). For each remaining mobile terminal orientation and/or mobile terminal configuration, test electronics 20 re-initialize the frequency channel (blocks 176 and 180) and repeat the gain estimation process (blocks 164 through 172) to estimate the antenna gain.

Once the reference sensitivity has been measured for each combination of frequency channel and mobile terminal configuration and the antenna gain has been estimated for each mobile terminal orientation in each combination of frequency channel and mobile terminal configuration, sensitivity calculator 26 calculates the sensitivity for each mobile terminal orientation by adjusting the reference sensitivity for a give frequency channel and mobile terminal configuration based on each estimated antenna gain corresponding to each orientation for the give frequency channel and mobile terminal configuration (block 190). For example, the radiated sensitivity for each mobile terminal orientation in a given frequency channel and mobile terminal configuration may be calculated by adding the reference sensitivity, $S_r$, to the estimated antenna gain, as shown in Equation 1:

$$S=P_A-P_{meas}+S_r \quad \text{(Eq. 1)}$$

where $P_A-P_{meas}$ represents the estimated antenna gain. This process is repeated for each combination of frequency channel and mobile terminal configuration.

Further, when the correction factors have been measured for each frequency channel (block 110), the correction factors may be applied to the reference sensitivity and the measured power level to improve the accuracy of the calculated sensitivity. Embodiments that use the correction factors may calculate the radiated sensitivity for each mobile terminal orientation in each combination of frequency channel and mobile terminal configuration according to Equation 2:

$$S=P_A-P_{corr}+S_{corr}, \quad \text{(Eq. 2)}$$

where $P_{corr}$ represents the measured power level corrected by the corresponding correction factor, $S_{corr}$ represents the reference sensitivity corrected by the corresponding correction factor, and $P_A-P_{corr}$ represents the estimated antenna gain corrected by the correction factor corresponding to $P_{meas}$.

While the process of FIG. 9B estimates the antenna gain associated with each frequency channel before changing the mobile terminal orientation and/or mobile terminal configuration, those skilled in the art will appreciate that the process is not limited to this sequence of steps. For example, the antenna gain may be estimated for each mobile terminal orientation at a given frequency channel. Once the antenna gain estimate has been determined for each mobile terminal orientation at the current frequency channel and mobile terminal configuration, the test electronics 20 re-initialize the mobile terminal orientation and repeat the gain estimation process for each new combination of frequency channel and mobile terminal configuration.

The above radiated sensitivity measurement process is generally described in terms of the mobile terminal orientation, frequency channel, and mobile terminal configuration requirements for GSM radiated sensitivity as outlined by the CTIA receiver standard. However, those skilled in the art will appreciate that the above-described radiated sensitivity measurement process is not so limited, and is applicable to any test standard that requires GSM radiated sensitivity measurements for GSM mobile terminals. The above-described radiated sensitivity measurement process may also be used to test mobile terminals using other communications protocols, such as TDMA or any other protocol capable of providing measured power levels to the test equipment. Further, those skilled in the art will appreciate that the number of mobile terminal orientations, frequency channels, and/or mobile terminal configurations tested may be increased or decreased as desired.

The above described test method provides significant time and cost advantages over the conventional GSM radiated sensitivity test method. Table 1 illustrates an exemplary time chart (according to the CTIA receiver standard) that compares the conventional radiated sensitivity test method with the new test method described above. As shown in Table 1, it takes approximately 90 seconds, on average, to determine each radiated sensitivity test point using the conventional GSM radiated sensitivity test method. According to the CTIA receiver standard, as discussed above, a single-band GSM mobile terminal requires 144 radiated sensitivity measurements, corresponding to vertical and horizontal measurements for each of 72 mobile terminal orientations, for each frequency channel (low, medium, and high) of each mobile terminal configuration (free-space, left-ear, and right-ear). Therefore, a complete GSM radiated sensitivity test on a single-band GSM mobile terminal requires 1,944 minutes (90 s×144×9) or 32.4 hours according to the conventional test method.

TABLE 1

Time Comparison Between "Old" and "New" Test Methods

| | Traditional Method | New Method (Characterization) | New Method (Data Collection) | New Method (Total) | Time Savings |
|---|---|---|---|---|---|
| One receive sensitivity point | 90 seconds | — | 6 seconds | 6 seconds | 84 seconds |
| One 3-D pattern requires 144 data points (CTIA) | 216 minutes | (A) 20 minutes plus (B) 2 minutes | 14.4 minutes | 34.4 minutes | 181.6 minutes |
| Nine 3-D patterns per band (3 freq. channels on each of 3 mobile terminal configurations) | 1,944 minutes | (A) 60 minutes plus (B) 18 minutes | 129.6 minutes | 207.6 minutes | 1,736.4 minutes |
| Single Band GSM Mobile Terminal | 32.4 hours | 1.3 hours | 2.2 hours | 3.5 hours | 28.9 hours |
| Dual Band GSM Mobile Terminal | 64.8 hours | 2.6 hours | 4.4 hours | 7.0 hours | 57.4 hours |
| Triple Band GSM Mobile Terminal | 97.2 hours | 3.9 hours | 6.6 hours | 10.5 hours | 86.7 hours |

A complete GSM radiated sensitivity test on a single band GSM mobile terminal performed according to the new test method described above requires 207.6 minutes or 3.5 hours. This total test time is made up of the characterization time and the data collection time. The characterization time is the time required to determine the correction factor for each frequency channel and the reference sensitivity, $S_r$, for each combination of frequency channel and mobile terminal configuration (blocks 110-130 in FIG. 6). The data collection time is the time required to acquire a measured RF power level and to calculate the resulting sensitivity for each orientation in each combination of frequency channel and mobile terminal configuration (blocks 160-190 in FIG. 6). Therefore, as shown in Table 1, the GSM radiated sensitivity test method described herein saves approximately 28.9 hours over the conventional test method for a single-band GSM mobile terminal. Assuming the cost of an appropriate test chamber ranges between $3,000 and $5,000 per 8 hours of testing, the new test method can save more than $86,000 per GSM radiated sensitivity test on a single-band GSM mobile terminal. These time and cost savings are magnified when considered for a dual-band (57.4 hours,~$172,000) or a triple-band (86.7 hours,~$260,000) mobile terminal.

In addition, preliminary test results, shown in Table 2, indicate that the radiated sensitivity measurements provided by the new test method are comparable to the radiated sensitivity measurements provided by the conventional test method.

TABLE 2

Data Comparison Between "Old" and "New" Test Methods (1900 MHz Band)

| Relative Orientation | | Radiated Sensitivity Measurement (dBm) | |
|---|---|---|---|
| Angle | | New Method | Conventional Method |
| 0° | FRONT | −101.04 | −100.43 |
| 45° | | −100.27 | −99.97 |
| 90° | | −98.92 | −98.13 |
| 135° | | −101.65 | −100.92 |
| 180° | | −103.38 | −102.99 |
| 225° | | −107.24 | −106.86 |
| 270° | | −107.67 | −106.62 |
| 315° | | −102.04 | −99.46 |
| 0° | SIDE | −102.09 | −101.83 |
| 45° | | −95.38 | −95.90 |
| 90° | | −102.76 | −102.15 |
| 135° | | −102.50 | −103.40 |
| 180° | | −104.09 | −103.84 |
| 225° | | −103.68 | −103.34 |
| 270° | | −99.77 | −99.73 |
| 315° | | −101.09 | −100.47 |
| 0° | AZIMUTH | −99.55 | −99.16 |
| 45° | | −96.83 | −96.01 |
| 90° | | −103.46 | −103.65 |
| 135° | | −105.68 | −105.67 |
| 180° | | −107.51 | −107.61 |
| 225° | | −102.55 | −103.19 |
| 270° | | −100.21 | −−99.96 |
| 315° | | −97.93 | −97.36 |

The test system used to generate these results only has one axis of rotation, so the data was collected with the mobile terminal positioned on its longitudinal side (Front data), positioned on its base (Azimuth data), and positioned on its back (Side data) at multiple angles. As shown in Table 2, the radiated sensitivity measurements provided by the new test method are accurate, on average, to within 0.78 dB for the front data, 0.13 dB for the side data, and 0.06 dB for the azimuth data of the radiated sensitivity measurements provided by the conventional test method. As a result, the results provided by the above-described test method are comparable to the results provided by the conventional test method. Therefore, the radiated sensitivity test system and procedure described herein provides comparable data in a cost effective manner as compared to the conventional test method.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of calculating the radiated sensitivity of a mobile terminal comprising:
   determining a reference sensitivity of the mobile terminal positioned in a reference orientation;
   estimating an antenna gain of a mobile terminal antenna when the mobile terminal is positioned in a test orientation; and
   adjusting the reference sensitivity based on the estimated antenna gain to calculate the sensitivity of the mobile terminal positioned in the test orientation.

2. The method of claim 1 wherein estimating the antenna gain of the mobile terminal antenna when the mobile terminal is positioned in the test orientation comprises:
   applying a known power level to the mobile terminal antenna when the mobile terminal is positioned in the test orientation; and
   comparing the known antenna power level to a measured power level reported by the mobile terminal to estimate the antenna gain.

3. The method of claim 2 wherein adjusting the reference sensitivity based on the estimated antenna gain to calculate the sensitivity of the mobile terminal positioned in the test orientation comprises calculating the sensitivity, S, of the mobile terminal according to:

$$S=P_A-P_{meas}+S_r,$$

where $P_A$ represents the known antenna power level, $P_{meas}$ represents the measured power level, $P_A-P_{meas}$ represents the estimated antenna gain, and $S_r$ represents the reference sensitivity.

4. The method of claim 1 further comprising determining a correction factor for each of a plurality of measured power levels reported by the mobile terminal.

5. The method of claim 4 wherein determining the correction factor for each of the plurality of measured power levels comprises:
   applying a plurality of known power levels to an input of a receiver of the mobile terminal; and
   comparing each of the known power levels to a corresponding measured power level reported by the mobile terminal to determine the correction factor for each measured power level.

6. The method of claim 4 wherein determining the reference sensitivity of the mobile terminal positioned in the reference orientation further comprises applying the corresponding correction factor to the reference sensitivity to determine a corrected reference sensitivity.

7. The method of claim 4 wherein estimating the antenna gain of the mobile terminal antenna comprises:
   applying a known power level to the mobile terminal antenna when the mobile terminal is positioned in the test orientation;
   applying the corresponding correction factor to a measured power level reported by the mobile terminal to determine a corrected power level; and
   comparing the known antenna power level to the corrected power level to determine a corrected estimate of the antenna gain.

8. The method of claim 4 wherein adjusting the reference sensitivity based on the estimated antenna gain to calculate the sensitivity of the mobile terminal positioned in the test orientation comprises calculating the sensitivity, S, of the mobile terminal receiver according to:

$$S=P_A-P_{corr}+S_{corr},$$

where $P_A$ represents the known antenna power level, $P_{corr}$ represents the measured power level as corrected by the correction factor, $P_A-P_{corr}$ represent the estimated antenna gain as corrected by the correction factor, and $S_{corr}$ represents the reference sensitivity as corrected by the correction factor.

9. The method of claim 4 further comprising determining the correction factors for one or more frequency channels.

10. The method of claim 1 wherein determining the reference sensitivity of the mobile terminal positioned in the reference orientation comprises:
    applying a known communication signal at one or more known antenna power levels to the mobile terminal antenna when the mobile terminal is positioned in the reference orientation;
    receiving a looped-back version of each communication signal and corresponding measured power level;
    calculating a signal quality of each looped-back version of the communication signal;
    comparing each of the calculated signal qualities to a predefined signal quality; and
    identifying the reference sensitivity as the measured power level that generally corresponds to the predefined signal quality.

11. The method of claim 10 wherein the signal quality is a bit error rate.

12. The method of claim 10 wherein the signal quality is a frame error rate.

13. The method of claim 1 further comprising adjusting the reference sensitivity based on the estimated antenna gain to calculate the sensitivity of the mobile terminal positioned in the test orientation for each combination of one or more frequency channels with one or more mobile terminal configurations.

14. The method of claim 13 wherein the one or more frequency channels comprise a high, a medium, and a low frequency in a frequency operating band of the mobile terminal.

15. The method of claim 13 wherein the one or more mobile terminal configurations comprise a free-space configuration, a left-ear configuration, and a right-ear configuration.

16. The method of claim 1 further comprising:
    estimating a second antenna gain when the mobile terminal is positioned in the second test orientation; and
    adjusting the reference sensitivity based on the second estimated antenna gain to calculate a second sensitivity of the mobile terminal positioned in a second test orientation.

17. A computer readable medium to store a computer program for calculating a radiated sensitivity of a mobile terminal, the computer program comprising:
    program instructions to determine a reference sensitivity of the mobile terminal positioned in a reference orientation;

program instructions to estimate an antenna gain of a mobile terminal antenna when the mobile terminal is positioned in a test orientation; and program instructions to adjust the reference sensitivity based on the estimated antenna gain to calculate the sensitivity of the mobile terminal positioned in the test orientation.

18. The computer readable medium of claim 17 wherein the program instructions to estimate the antenna gain of the mobile terminal antenna when the mobile terminal is positioned in the test orientation comprises:

program instructions to apply a known power level to the mobile terminal antenna when the mobile terminal is positioned in the test orientation; and program instructions to compare the known antenna power level to a measured power level reported by the mobile terminal to estimate the antenna gain.

19. The computer readable medium of claim 18 wherein the program instructions to adjust the reference sensitivity based on the estimated antenna gain to calculate the sensitivity of the mobile terminal positioned in the test orientation comprises program instructions to calculate the sensitivity, S, of the mobile terminal according to:

$$S=P_A-P_{meas}+S_r,$$

where $P_A$ represents the known antenna power level, $P_{meas}$ represents the measured power level, $P_A-P_{meas}$ represents the estimated antenna gain, and $S_r$ represents the reference sensitivity.

20. The computer readable medium of claim 17 further comprising program instructions to determine a correction factor for each of a plurality of measured power levels reported by the mobile terminal.

21. The computer readable medium of claim 20 wherein the program instructions to determine the correction factor for each of the plurality of measured power levels comprises:

program instructions to apply a plurality of known power levels to an input of a receiver of the mobile terminal; and program instructions to compare each of the known power levels to a corresponding measured power level reported by the mobile terminal to determine the correction factor for each measured power level.

22. The computer readable medium of claim 20 wherein the program instructions to determine the reference sensitivity of the mobile terminal positioned in the reference orientation further comprises program instructions to apply the corresponding correction factor to the reference sensitivity to determine a corrected reference sensitivity.

23. The computer readable medium of claim 20 wherein the program instructions to estimate the antenna gain of the mobile terminal antenna when the mobile terminal is positioned in the test orientation comprises:

program instructions to apply a known power level to the mobile terminal antenna when the mobile terminal is positioned in the test orientation;

program instructions to apply the corresponding correction factor to a measured power level reported by the mobile terminal to determine a corrected power level; and program instructions to compare the known antenna power level to the corrected power level to determine a corrected estimate of the antenna gain.

24. The computer readable medium of claim 20 wherein the program instructions to adjust the reference sensitivity based on the estimated antenna gain to calculate the sensitivity of the mobile terminal positioned in the test orientation comprises program instructions to calculate the sensitivity, S, of the mobile terminal receiver according to:

$$S=P_A-P_{corr}+S_{corr},$$

where $P_A$ represents the known antenna power level, $P_{corr}$ represents the measured power level as corrected by the correction factor, $P_A-P_{corr}$ represent the estimated antenna gain as corrected by the correction factor, and $S_{corr}$ represents the reference sensitivity as corrected by the correction factor.

25. The computer readable medium of claim 20 further comprising program instructions to determine the correction factors for one or more frequency channels.

26. The computer readable medium of claim 17 wherein the program instructions to determine the reference sensitivity of the mobile terminal positioned in the reference orientation comprises:

program instructions to apply a known communication signal at one or more known antenna power levels to the mobile terminal antenna when the mobile terminal is positioned in the reference orientation;

program instructions to receive a looped-back version of each communication signal and corresponding measured power level;

program instructions to calculate a signal quality of each looped-back version of the communication signal;

program instructions to compare each of the calculated signal qualities to a predefined signal quality; and program instructions to identify the reference sensitivity as the measured power level that generally corresponds to the predefined signal quality.

27. The computer readable medium of claim 17 further comprising program instructions to adjust the reference sensitivity based on the estimated antenna gain to calculate the sensitivity of the mobile terminal positioned in the test orientation for each combination of one or more frequency channels with one or more mobile terminal configurations.

28. The computer readable medium of claim 17 further comprising:

program instructions to estimate a second antenna gain when the mobile terminal is positioned in a second test orientation; and program instructions to adjust the reference sensitivity based on the second estimated antenna gain to calculate a second sensitivity of the mobile terminal positioned in the second test orientation.

29. A test system for calculating a radiated sensitivity of a mobile terminal comprising:

a first interface;

a sensitivity test processor for configuring the test system in one of a plurality of test modes;

wherein in a first test mode, the test system determines a reference sensitivity of the mobile terminal positioned in a reference orientation via the first interface;

wherein in a second test mode, the test system estimates an antenna gain of a mobile terminal antenna via the first interface when the mobile terminal is positioned in a test orientation; and a sensitivity calculator for calculating the sensitivity of the mobile terminal positioned in the test orientation by adjusting the reference sensitivity based on the estimated antenna gain.

30. The test system of claim 29 wherein in the second test mode, the sensitivity test processor configures the test system to:

apply a known power level to the mobile terminal antenna via the first interface when the mobile terminal is positioned in the test orientation; and compare the known antenna power level to a measured power level reported by the mobile terminal to estimate the antenna gain of the mobile terminal antenna when the mobile terminal is positioned in the test orientation.

31. The test system of claim 29 further comprising a second interface, wherein in a third test mode, the test system determines a correction factor for each of a plurality of measured power levels reported by the mobile terminal via the second interface.

32. The test system of claim 31 wherein in the third test mode, the sensitivity test processor configures the test system to:
 apply a plurality of known power levels to an input of a receiver of the mobile terminal via the second interface; and
 compare each of the known power levels to a corresponding measured power level reported by the mobile terminal to determine the correction factor for each measured power level.

33. The test system of claim 31 further comprising a memory for storing each correction factor.

34. The test system of claim 31 wherein in the second test mode, the sensitivity test processor configures the test system to:
 apply a known power level to the mobile terminal antenna via the first interface when the mobile terminal is positioned in the test orientation;
 apply the corresponding correction factor to a measured power level reported by the mobile terminal to determine a corrected power level; and
 compare the known antenna power level to the corrected power level to estimate the antenna gain of the mobile terminal antenna when the mobile terminal is positioned in the test orientation.

35. The test system of claim 31 wherein at least one of the first and third test modes comprise a characterization mode.

36. The test system of claim 31 wherein the second interface comprises a coaxial cable.

37. The test system of claim 29 wherein in the first test mode, the sensitivity test processor configures the system to:
 apply a known communication signal at one or more known antenna power levels to the mobile terminal antenna when the mobile terminal is positioned in the reference orientation;
 receive a looped-back version of each communication signal and corresponding measured power level;
 calculate a signal quality of each looped-back version of the communication signal;
 compare each of the calculated signal qualities to a predefined signal quality; and
 identify the reference sensitivity as the measured power level that generally corresponds to the predefined signal quality.

38. The test system of claim 37 wherein the signal quality is a bit error rate.

39. The test system of claim 37 wherein the signal quality is a frame error rate.

40. The test system of claim 29 wherein the second test mode comprises a data collection mode.

41. The test system of claim 29 wherein the first interface comprises a test antenna.

* * * * *